(12) United States Patent
Lu

(10) Patent No.: US 10,694,651 B2
(45) Date of Patent: Jun. 23, 2020

(54) CHIP-PLACING METHOD PERFORMING AN IMAGE ALIGNMENT FOR CHIP PLACEMENT AND CHIP-PLACING APPARATUS THEREOF

(71) Applicant: SAUL TECH TECHNOLOGY CO., LTD., Hsinchu (TW)

(72) Inventor: Yen-Hao Lu, Hsinchu (TW)

(73) Assignee: SAUL TECH TECHNOLOGY CO., LTD., Hsinchu (TW)

( * ) Notice: Subject to any disclaimer, the term of this patent is extended or adjusted under 35 U.S.C. 154(b) by 220 days.

(21) Appl. No.: 16/044,505

(22) Filed: Jul. 24, 2018

(65) Prior Publication Data

US 2019/0200495 A1    Jun. 27, 2019

(30) Foreign Application Priority Data

Jun. 20, 2017    (TW) .............................. 106120470 A
Jun. 20, 2017    (TW) .............................. 106120471 A

(51) Int. Cl.
*G06K 9/00*        (2006.01)
*H05K 13/08*       (2006.01)
(Continued)

(52) U.S. Cl.
CPC ......... *H05K 13/0812* (2018.08); *G06T 7/001* (2013.01); *G06T 7/74* (2017.01);
(Continued)

(58) Field of Classification Search
CPC .......... H05K 13/0812; H05K 13/0815; H05K 13/0409; G06T 7/74; G06T 7/001;
(Continued)

(56) References Cited

U.S. PATENT DOCUMENTS 6,389,688 B1 *    5/2002    Srivastava ............ H01L 21/681
                                                        29/833
6,457,232 B1 *   10/2002    Isogai ................ H05K 13/0812
                                                        29/833
(Continued)

FOREIGN PATENT DOCUMENTS

EP              1 802 192 A1    6/2007

*Primary Examiner* — Solomon G Bezuayehu
(74) *Attorney, Agent, or Firm* — Maschoff Brennan

(57) ABSTRACT

A chip-placing method for performing an image alignment of chip placement comprises a chip pick-up step, a reference-image capturing step, an alignment-image capturing step, a calculating and processing step, a calibration adjusting step and a placing step. An image(s) of a marking member and a chip sucked by a chip-placing member is/are captured from an opposite direction so as to obtain a relative position information of the chip in relation to the marking member. An image showing the marking member and the substrate is captured from a backside so as to obtain a relative position information of the marking member in relation to the substrate. A position calibration relationship information of the position of the chip in relation to a to-be-placed location of the substrate is obtained according to those relative position information. Therefore, a relative position of the chip-placing member in relation to the to-be-placed location is calibrated.

11 Claims, 11 Drawing Sheets

(51) Int. Cl.
  *H05K 13/04* (2006.01)
  *H01L 21/67* (2006.01)
  *G06T 7/00* (2017.01)
  *H01L 21/68* (2006.01)
  *G06T 7/73* (2017.01)
  *H01L 23/00* (2006.01)

(52) U.S. Cl.
  CPC ...... *H01L 21/67259* (2013.01); *H01L 21/681* (2013.01); *H01L 24/00* (2013.01); *H05K 13/0409* (2018.08); *H05K 13/0815* (2018.08); *G06T 2207/30148* (2013.01); *G06T 2207/30204* (2013.01)

(58) Field of Classification Search
  CPC . G06T 2207/30204; G06T 2207/30148; H01L 24/00; H01L 21/67259; H01L 21/681; H01L 2224/81908; H01L 2224/75753; H01L 2224/75745; H01L 2224/8113; H01L 2223/54426; H01L 24/75; H01L 23/544
  See application file for complete search history.

(56) References Cited

U.S. PATENT DOCUMENTS

| | | | |
|---|---|---|---|
| 6,892,447 B1* | 5/2005 | Yamauchi | H01L 21/67144 29/740 |
| 8,768,514 B2* | 7/2014 | Hoshikawa | H04N 5/23248 700/259 |
| 2002/0124399 A1* | 9/2002 | Ogimoto | H01L 21/681 29/833 |
| 2005/0071990 A1* | 4/2005 | Nakamura | H01L 21/67259 29/740 |
| 2005/0210667 A1* | 9/2005 | Yakiyama | H05K 13/089 29/740 |
| 2007/0020800 A1* | 1/2007 | Ishikawa | H01L 21/67144 438/106 |
| 2007/0145102 A1* | 6/2007 | Blessing | H05K 13/0812 228/101 |
| 2014/0154037 A1* | 6/2014 | Sen | H01L 21/67144 414/744.2 |
| 2015/0245549 A1* | 8/2015 | Kurita | H05K 13/0812 228/102 |
| 2016/0079199 A1* | 3/2016 | Seok | B23K 1/00 228/102 |
| 2020/0006099 A1* | 1/2020 | Yamauchi | H01L 21/027 |

* cited by examiner

CHIP-PLACING METHOD PERFORMING AN IMAGE ALIGNMENT FOR CHIP PLACEMENT AND CHIP-PLACING APPARATUS THEREOF

FIELD OF THE INVENTION

The present invention relates to a chip-placing method and a chip-placing apparatus, and more particularly to a chip-placing method that performs an image alignment for chip placement and a chip-placing apparatus thereof.

BACKGROUND OF THE INVENTION

In a wafer-level packaging process of semiconductor, a wafer is cut into a plurality of chips, from which good chips are selected and are reallocated on a surface of substrate for subsequent processes. In the process of reallocation, for sake of precision manufacturing, the precision of chip placement and chip arrangement are with extremely strict requirements, i.e., usually with accuracy about some microns or even less. In order to ensure the high accuracy of chip placing, in the conventional chip-placing method, an image capturing device is configured to record a position error of chips on each to-be-placed locations of the substrate. An average error is obtained from the position errors of all to-be-placed locations derived after repeating several times. The average error is applied to compensate the relative position of the chip in relation to the substrate when the chip is placed.

However, the above conventional method is required to be repeated a plurality of times in order to establish the error average of the to-be-placed locations on the substrate. Moreover, when a new error factor is generated, such as thermal deformation caused by temperature changes, the error cannot be corrected in time to cause that the error average of the to-be-placed locations on the substrate must be re-established. Therefore, the conventional chip-placing method cannot be performed efficiently and cannot fit to instantly achieve a more strict requirement in terms of accuracy and precision. Furthermore, in EPO patent publication number 1802192, it discloses a method for mounting a flip chip on a substrate. However, a chip gripper and a reference mark used in the method are not separately disposed in a distance with each other. The method of the EPO application causes a problem that, in order to perform an alignment, it requires to provide additional alignment patterns around the chip which is gripped by the chip gripper.

SUMMARY OF THE INVENTION

Accordingly, the objective of the present invention is to provide a chip-placing method that performs an image alignment for chip placement and a chip-placing apparatus performing the chip-placing method.

The technical means adopted by the present invention to overcome the drawbacks in prior art provides a chip-placing method that performs an image alignment for chip placement. The chip-placing method is applied while a chip-placing member of a chip-placement apparatus is configured to move to a to-be-placed location on a substrate, the chip-placing apparatus includes a chip-placing device, a reference-image capturing device and an alignment-image capture device, and the chip-placing device includes the chip-placing member and a marking member adjacent to the chip-placing member. The chip-placing method comprises a chip pick-up step that enables the chip-placing member to suck a chip; a reference-image capturing step that enables the reference-image capturing device to capture an image of the marking member from an opposite direction of the chip-placing device, and captures an image of the chip sucked by the chip-placing member so as to obtain a relative position information of the chip in relation to the marking member; an alignment-image capturing step that enables the alignment-image capture device to capture, from a backside of the chip-placing device, an image showing the marking member and the substrate so as to obtain a relative position information of the marking member in relation to the substrate; a calculating and processing step that obtains a position calibration relationship information of the position of the chip sucked by the chip-placing member in relation to a to-be-placed location of the substrate according to the relative position information of the chip in relation to the marking member and the relative position information of the marking member in relation to the substrate; a calibration adjusting step that calibrates a relative position of the chip-placing member in relation to the to-be-placed location according to the position calibration relationship information so as to align the position of the chip sucked by the chip-placing member with the to-be-placed location; and a chip placing step that enables the chip-placing member to place the chip.

According to one embodiment of the present invention, in the reference-image capturing step, the reference-image capturing device captures one image showing the marking member and the chip sucked by the chip-placing member so as to obtain the relative position information of the chip in relation to the marking member.

According to one embodiment of the present invention, the reference-image capturing step includes a two-separate capturing sub-step and an image-overlapping sub-step, the two-separate capturing sub-step enabling the reference-image capturing device in a reference position to respectively capture the image of the marking member and the image of the chip sucked by the chip-placing member, and the image-overlapping sub-step enables the image of the marking member and the image of the chip sucked by the chip-placing member to be overlapped so as to obtain the relative position information of the chip in relation to the marking member.

According to one embodiment of the present invention, the chip-placing member and the marking member are disposed as separated with each other with a predetermined fixed distance such that the two-separate capturing sub-step enables the chip-placing device to move the predetermined fixed distance to enable the reference-image capturing device in the reference position to respectively capture the image of the marking member and the image of the chip sucked by the chip-placing member.

According to one embodiment of the present invention, the calibration adjusting step enables the position of the chip sucked by the chip-placing member is aligned with the to-be-placed location by calibrating a relative position and/or a relative angle between the chip-placing member and the to-be-placed location according to the position calibration relationship information.

According to one embodiment of the present invention, the alignment-image capturing step is performed prior to the chip pick-up step.

According to one embodiment of the present invention, the alignment-image capturing step is performed after the chip pick-up step.

According to one embodiment of the present invention, the alignment-image capturing step obtains the relative position information of the marking member in relation to the substrate according to a visual characteristic of the substrate.

Accordingly, another objective of the present invention is to provide a chip-placing apparatus.

The chip-placing apparatus comprises a chip-placing device including a chip-placing member and a marking member adjacent to the chip-placing member, in which the chip-placing member is operated to suck a chip and performs a chip placement; a reference-image capturing device configured to capture an image of the marking member from an opposite direction of the chip-placing device, and to capture an image of the chip sucked by the chip-placing member; an alignment-image capture device configured to capture, from a backside of the chip-placing device, an image showing the marking member and a substrate; and a control system including: a positioning unit configured to be in power connection to the chip-placing device; a calculating and processing unit configured to be in signal connection to the reference-image capturing device and the alignment-image capture device, the calculating and processing unit obtaining a relative position information of the chip in relation to the marking member according to the image(s) captured by the reference-image capturing device, the calculating and processing unit obtaining a relative position information of the marking member in relation to the substrate according to the image captured by the alignment-image capture device, the calculating and processing unit calculating a position calibration relationship information of the position of the chip sucked by the chip-placing member in relation to a to-be-placed location of the substrate according to the relative position information of the chip in relation to the marking member and according to the relative position information of the marking member in relation to the substrate; and a calibration adjusting unit configured to be in signal connection to the calculating and processing unit and the positioning unit, the calibration adjusting unit calibrating and adjusting the relative position of the chip-placing member in relation to the to-be-placed location according to the position calibration relationship information so as to align the position of the chip sucked by the chip-placing member with the to-be-placed location.

According to one embodiment of the present invention, the marking member is a photomask or a light transmitting member having image feature symbols.

According to one embodiment of the present invention, the marking member is disposed on the periphery of the chip-placing member, and the reference-image capturing device captures one image showing the marking member and the chip sucked by the chip-placing member.

According to one embodiment of the present invention, the chip-placing member and the marking member are disposed as separated with each other with a predetermined fixed distance, the control system further includes an image-overlapping unit configured to be in signal connection to the reference-image capturing device, the alignment-image capture device and the calculating and processing unit, and the reference-image capturing device in a reference position respectively captures the image of the marking member and the image of the chip sucked by the chip-placing member, and the image of the marking member and the image of the chip sucked by the chip-placing member are overlapped by the image-overlapping unit so as to obtain the relative position information of the chip in relation to the marking member.

According to one embodiment of the present invention, the position calibration relationship information includes an error relationship information of position and/or angle, and the position of the chip sucked by the chip-placing member is aligned with the to-be-placed location by calibrating a relative position and/or a relative angle of the chip-placing member in relation to the to-be-placed location by the calibration adjusting unit according to the error relationship information.

According to one embodiment of the present invention, the calibration adjusting unit controls the positioning unit to fine adjust the chip-placing member according to the error relationship information such that the position of the chip sucked by the chip-placing member is aligned with the to-be-placed location.

According to one embodiment of the present invention, the present invention further includes a mobile stage being provided to carry the substrate, the mobile stage configured to be in signal connection to the calibration adjusting unit, and the calibration adjusting unit fine adjusting the mobile stage according to the error relationship information such that the position of the chip sucked by the chip-placing member is aligned with the to-be-placed location.

According to one embodiment of the present invention, the present invention further includes an(/some) identifier(s) that is(/are) printed on the substrate, the calculating and processing unit obtaining the relative position information of the marking member in relation to the substrate according to the image of the identifier(s) obtained from the image captured by the alignment-image capture device.

By the technical means used by the present invention, the chip-placing member can be accurately moved to each to-be-placed location of the substrate. Therefore, the precision and accuracy for the chip-placing when the substrate is with identifier(s) and for the arrangement when the substrate is without identifier can be greatly improved.

BRIEF DESCRIPTION OF THE DRAWINGS

The structure and the technical means adopted by the present invention to achieve the above and other objectives can be best understood by referring to the following detailed description of the preferred embodiments and the accompanying drawings.

DETAILED DESCRIPTION OF THE PREFERRED EMBODIMENTS

The embodiments of the present invention are described below with reference to FIG. 1 to FIG. 11. The description is for describing the preferred embodiments of the present invention, and is not intended to limit the way of embodying the present invention.

Figure 1:
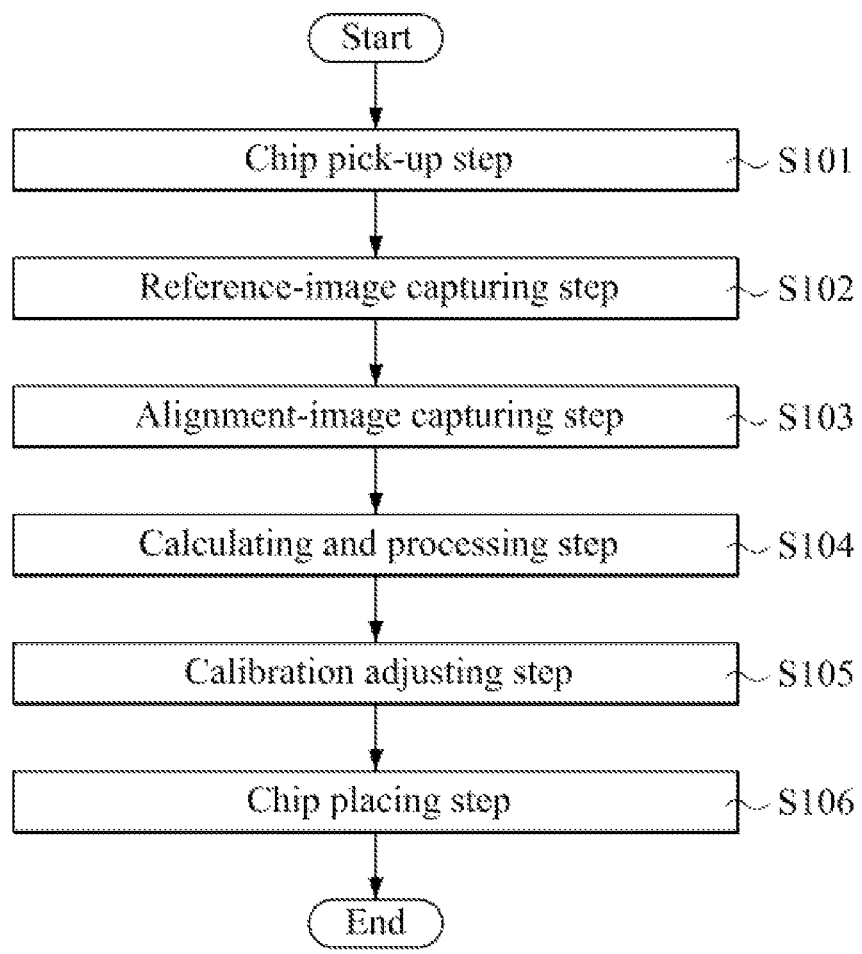
FIG. 1 is a flowchart illustrating the chip-placing method for performing an image alignment of chip placement according to the first embodiment of the present invention.
Figure 2:
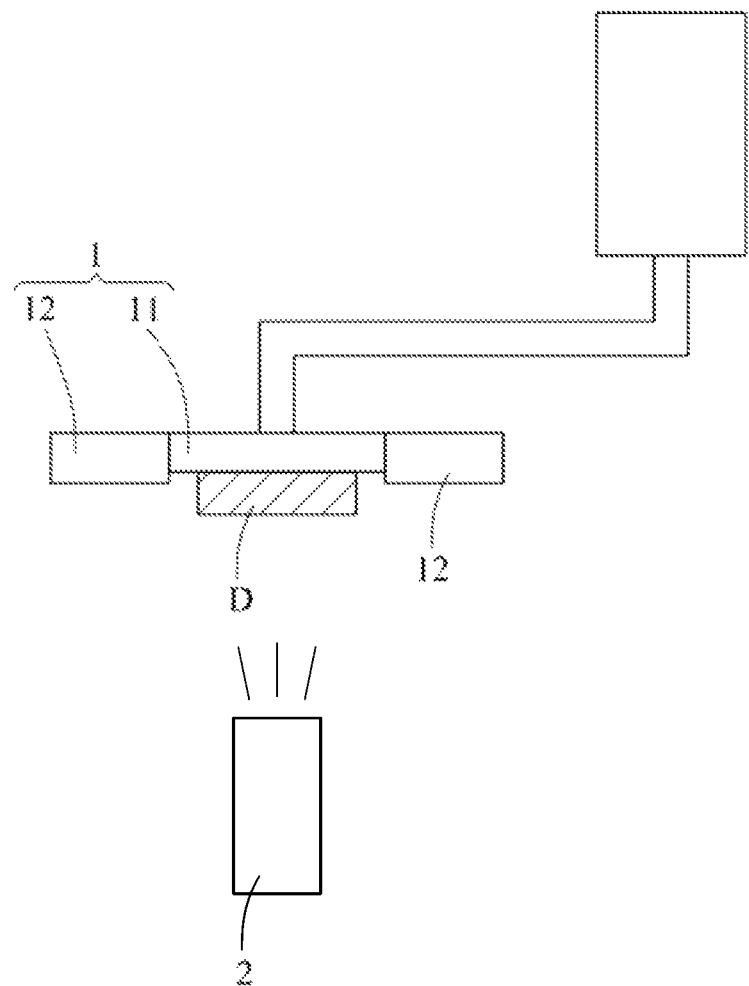
FIG. 2 is a schematic diagram illustrating the reference-image capturing step according to the first embodiment of the present invention.
Figure 3:
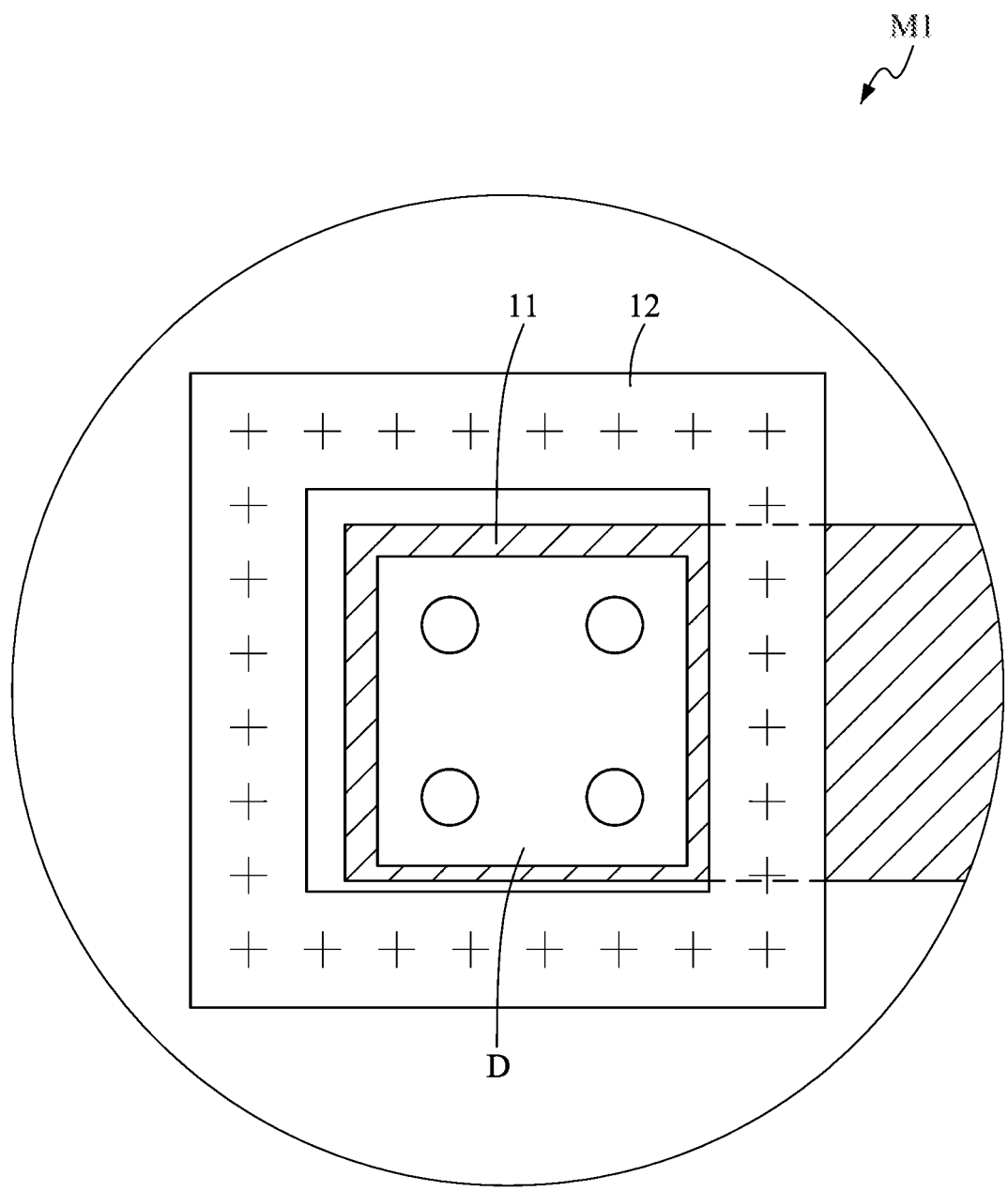
FIG. 3 is a schematic diagram illustrating the image captured by the reference-image capturing device according to the first embodiment of the present invention.
Figure 4:
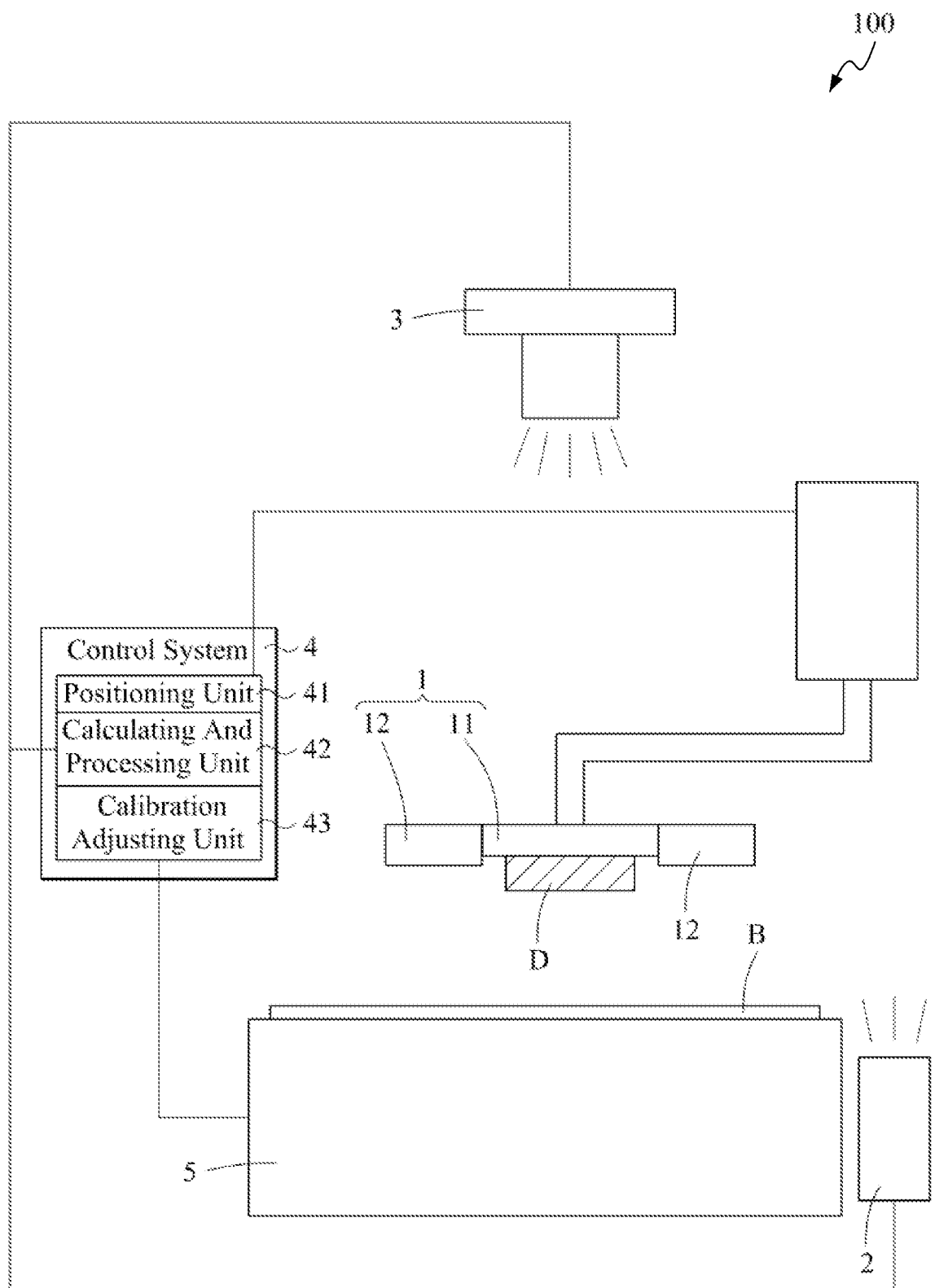
FIG. 4 is a schematic diagram illustrating the chip-placing apparatus according to the first embodiment of the present invention.

As shown in FIGS. 1 to 5, a chip-placing method that performs an image alignment for chip placement according to the first embodiment of the present invention is applied while a chip-placing member 11 of a chip-placement apparatus 100 is configured to move to a to-be-placed location on a substrate B. As shown in FIG. 4, the chip-placing apparatus 100 comprises a chip-placing device 1, a reference-image capturing device 2, an alignment-image capture device 3 and a control system 4. The chip-placing method that performs an image alignment for chip placement in the first embodiment comprises a chip pick-up step S101, a reference-image capturing step S102, an alignment-image capturing step S103, a calculating and processing step S104, a calibration adjusting step S105, and a chip placing step S106.

The chip-placing device 1 includes a chip-placing member 11 and a marking member 12 adjacent to the chip-placing member 11. The chip-placing member 11 is operated to suck a chip D and performs a chip placement. In this embodiment, the chip-placing member 11 is a suction-type mechanical arm, the marking member 12 is disposed on the periphery of the chip-placing member 11, and the present invention is not limited thereto. The marking member 12 is a light transmitting member having image feature symbols, such as a photomask.

The control system 4 includes a positioning unit 41, a calculating and processing unit 42, and a calibration adjusting unit 43. The positioning unit 41 is configured to be in power connection to the chip-placing device 1. The calculating and processing unit 42 is configured to be in signal connection to the reference-image capturing device 2 and the alignment-image capture device 3. The calibration adjusting unit 43 is configured to be in signal connection to the calculating and processing unit 42 and the positioning unit 41.

The chip-placing apparatus 100 according to the first embodiment of the present invention will be described below as performing the chip-placing method.

In the chip pick-up step S101, the chip-placing member 11 is configured to suck a chip D.

Next, in the reference-image capturing step S102, as shown in FIG. 2, the reference-image capturing device 2 captures an image M1 of the marking member 12 and the chip D which is sucked by the chip-placing member 11 (as shown in FIG. 3) from an opposite direction of the chip-placing device 1 such that the calculating and processing unit 42 obtains a relative position information of the chip D in relation to the marking member 12. The opposite direction of the chip-placing device 1 refers to a direction that faces the marking member 12 and the chip-placing member 11. In this embodiment, the reference-image capturing device 2 captures one image showing the marking member 12 and the chip D which is sucked by the chip-placing member 11 such that the calculating and processing unit 42 obtains the relative position information of the chip D in relation to the marking member 12.

As shown in FIG. 3, the surface of the marking member 12 has a cross-shaped marking pattern, and the surface of chip D has a specific visual appearance (represented by circles in this embodiment). However, the present invention is not limited thereto. The pattern and arrangement of the surface of the marking member 12 can also be other marking forms, and the surface of the chip D may be any other kinds of visual appearance.

Figure 5:
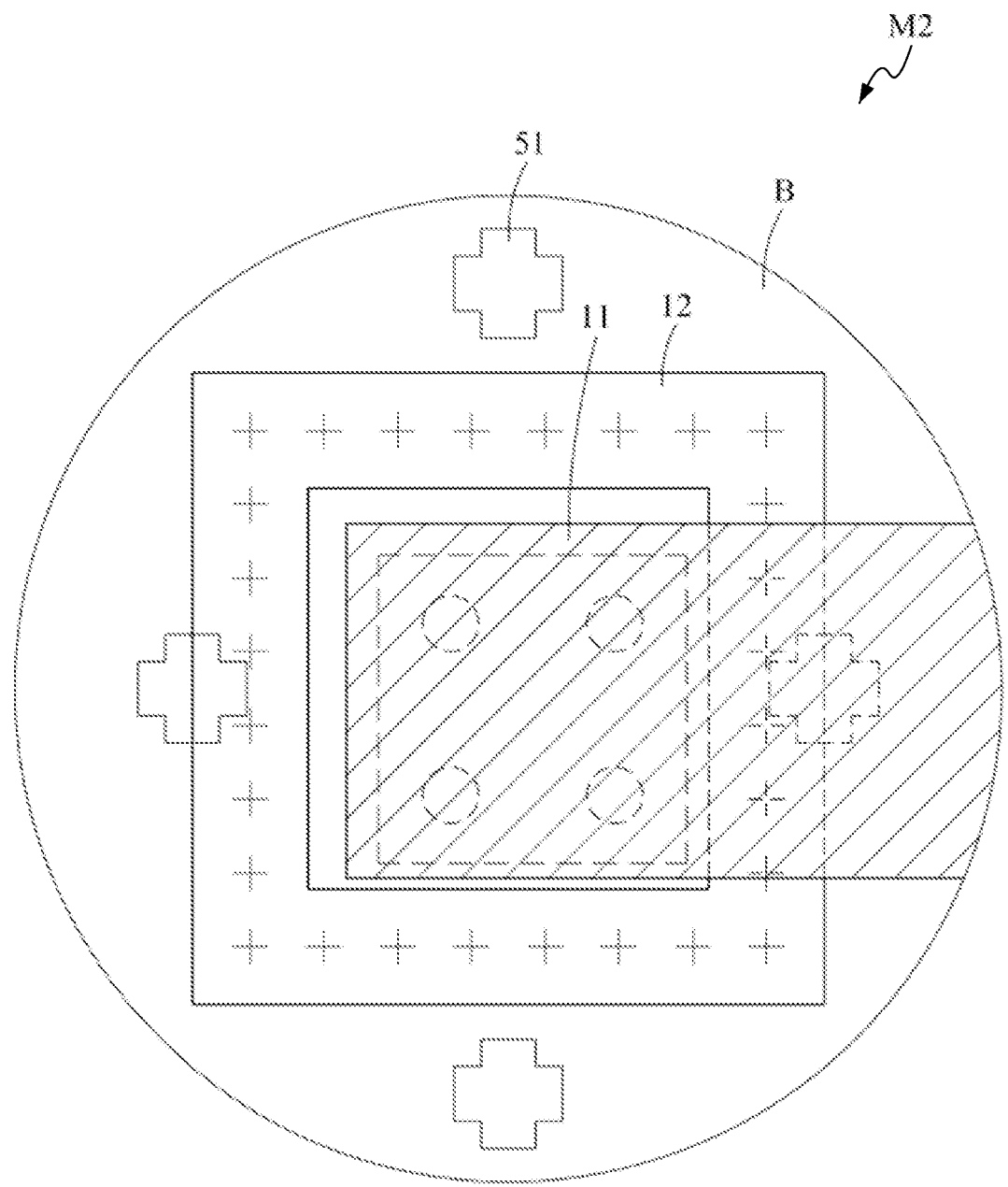
FIG. 5 is a schematic diagram illustrating the image captured by the alignment-image capturing device according to the first embodiment of the present invention.
Figure 6:
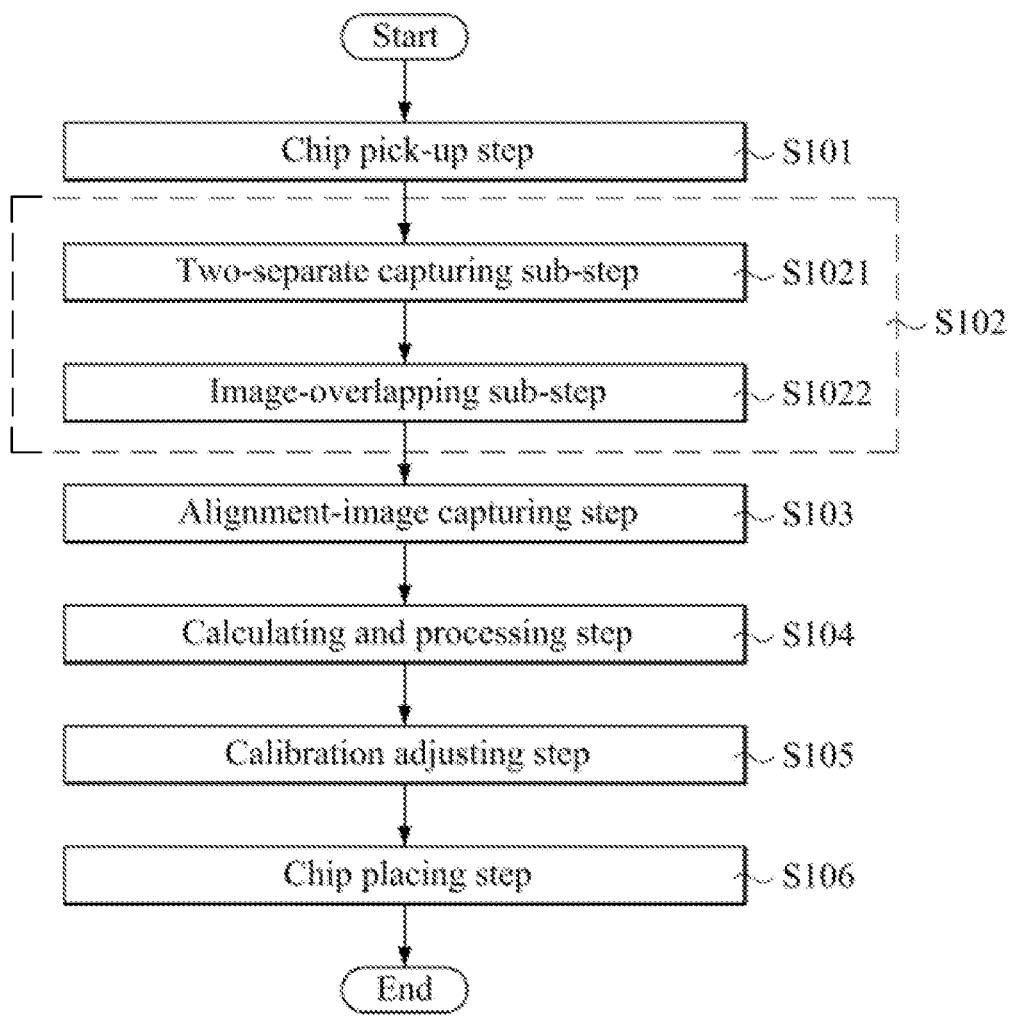
FIG. 6 is a flowchart illustrating the chip-placing method for performing an image alignment of chip placement according to the second embodiment of the present invention.

As shown in FIG. 4, then, the chip-placing device 1 is moved by the positioning unit 41 so as to face forward the substrate B. In this embodiment, the substrate B is parallel to the ground, and the chip-placing device 1 is moved to be beyond the substrate B. However, the present invention is not limited thereto. The substrate B could also be provided perpendicular to the ground. In the alignment-image capturing step S103, the alignment-image capture device 3 captures, from a backside of the chip-placing device 1, an image M2 showing the marking member 12 and the substrate B (as shown in FIG. 5) such that the calculating and processing unit 42 obtains a relative position information of the marking member 12 in relation to the substrate B. The alignment-image capture device 3 could further include at least one mirror and an image capturing member. The mirror is configured to change the path of the light so that said, image capturing member provided at other positions captures the image M2 showing the marking member 12 and the substrate B from the backside of the chip-placing device 1.

In this embodiment, the chip-placing apparatus 100 further includes an(/some) identifier(s) 51 (represented by a thick cross in FIG. 5) that is(/are) printed on the substrate B. In the alignment-image capturing step S103, the calculating and processing unit 42 obtains the relative position information of the marking member 12 in relation to the substrate B according to the image of the identifier(s) 51 obtained from the image M2 captured by the alignment-image capture device 3.

For example, the thick crosses identifier(s) 51 is(/are) pre-set around each of the to-be-placed locations for marking each of the to-be-placed locations out. However, the present invention is not limited thereto. The identifier(s) 51 can be used to indicate the to-be-placed location in various ways. In addition, the aforementioned to-be-placed location is not limited to in the image M2 captured by the alignment-image capture device 3. In another example, the surface of substrate B has no identifier 51. Therefore, the calculating and processing unit 42 obtains the relative position information of the marking member 12 in relation to the substrate B according to a visual characteristic of the substrate B.

Next, in the calculating and processing step S104, the calculating and processing unit 42 calculates and obtains a position calibration relationship information of the position of the chip D sucked by the chip-placing member 11 in relation to a to-be-placed location of the substrate B according to the relative position information of the chip D in relation to the marking member 12 and the relative position information of the marking member 12 in relation to the substrate B. In detail, in this embodiment, the calculating and processing unit 42 obtains the relative position information of the chip D in relation to the marking member 12 according to the image M1 captured by the reference-image capturing device 2 in the reference-image capturing step S102. And the calculating and processing unit 42 obtains the relative position information of the marking member 12 in relation to the substrate B according to the image M2 captured by the alignment-image capture device 3 in the alignment-image capturing step S103. Then, in the calculating and processing step S104, the calculating and processing unit 42 calculates a position calibration relationship information of the position of the chip D sucked by the chip-placing member 11 in relation to the to-be-placed location of the substrate B according to the relative position information of the chip D in relation to the marking member 12 and according to the relative position information of the marking member 12 in relation to the substrate B.

Then, in the calibration adjusting step S105, the calibration adjusting unit 43 calibrates and adjusts the relative position of the chip-placing member 11 in relation to the to-be-placed location according to the position calibration relationship information so as to align the position of the chip D sucked by the chip-placing member 11 with the to-be-placed location. For example, by adjusting the relative position of the chip-placing member 11 in relation to the to-be-placed location, the outer edge of the sucked chip D can be aligned with the outer edge of the thick cross (the to-be-placed location).

In the present embodiment, the position calibration relationship information includes an error relationship information of position and/or angle. The position of the chip D sucked by the chip-placing member 11 is aligned with the to-be-placed location by the calibration adjusting unit 43 calibrating a relative position and/or a relative angle between the chip-placing member 11 and the to-be-placed location according to the error relationship information.

In the present embodiment, the calibration adjusting unit 43 controls the positioning unit 41 to fine adjust the position and/or angle of the chip-placing member 11 according to the error relationship information such that the position of the chip D sucked by the chip-placing member 11 is aligned with the to-be-placed location.

As shown in FIG. 4, the chip-placing apparatus 100 further includes a mobile stage 5 provided to carry the substrate B. The mobile stage 5 is configured to be in signal connection to the calibration adjusting unit 43. The calibration adjusting unit 43 fine adjusts the position and/or angle of the mobile stage 5 according to the error relationship information such that the position of the chip D sucked by the chip-placing member 11 is aligned with the to-be-placed location.

Finally, in the chip placing step S106, the positioning unit 41 enables the chip-placing member 11 to place the chip.

By the chip-placing method and chip-placing apparatus of the above embodiments, compared with the prior art, the present invention is with advantage that the precision and accuracy for the chip-placing when the substrate B is with identifier(s) 51 and for the arrangement when the substrate B is without identifier 51 can be greatly improved.

A second embodiment of the present invention is also provided. As shown in FIGS. 6 to 10, a chip-placing method that performs an image alignment for chip placement and a chip-placement apparatus 200 according to the second embodiment of the present invention are substantially the same as the chip-placing method and the chip-placement apparatus 100 according to the first embodiment. The difference is in that the reference-image capturing step S102 of the chip-placing method that performs an image alignment for chip placement according to the second embodiment includes a two-separate capturing sub-step S1021 and an image-overlapping sub-step S1022, the chip-placing member 11a and the marking member 12a are disposed as separated with each other with a predetermined fixed distance L, and the control system 4 further includes an image-overlapping unit 44 configured to be in signal connection to the reference-image capturing device 2, the alignment-image capture device 3 and the calculating and processing unit 43.

The chip-placing apparatus 200 according to the second embodiment of the present invention will be described below as performing the chip-placing method.

In the chip pick-up step S101, the chip-placing member 11a is configured to suck a chip D in the same way as the chip pick-up step S101 in the first embodiment.

Figure 7A:
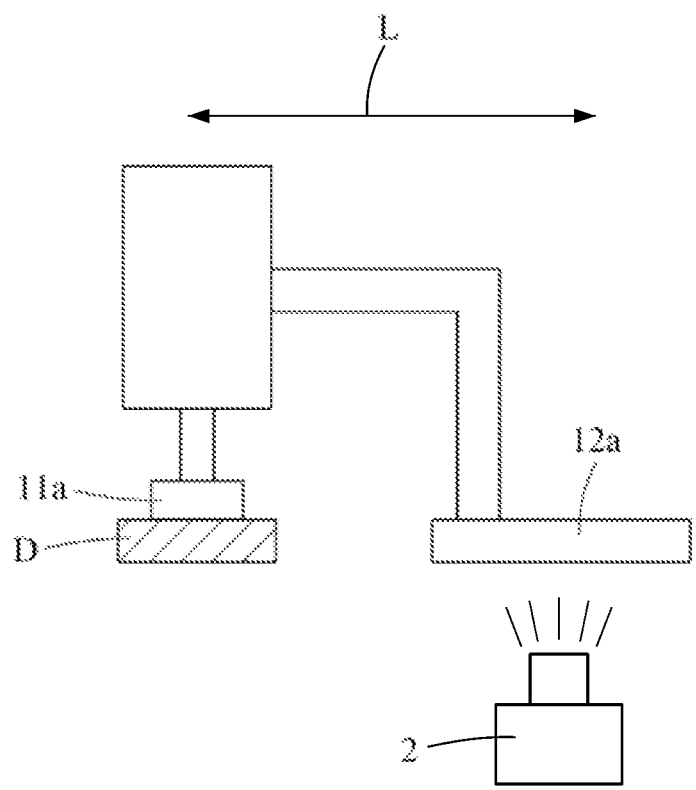
FIGS. 7A and 7B are schematic diagrams illustrating the two-separate capturing sub-step according to the second embodiment of the present invention.
Figure 7B:
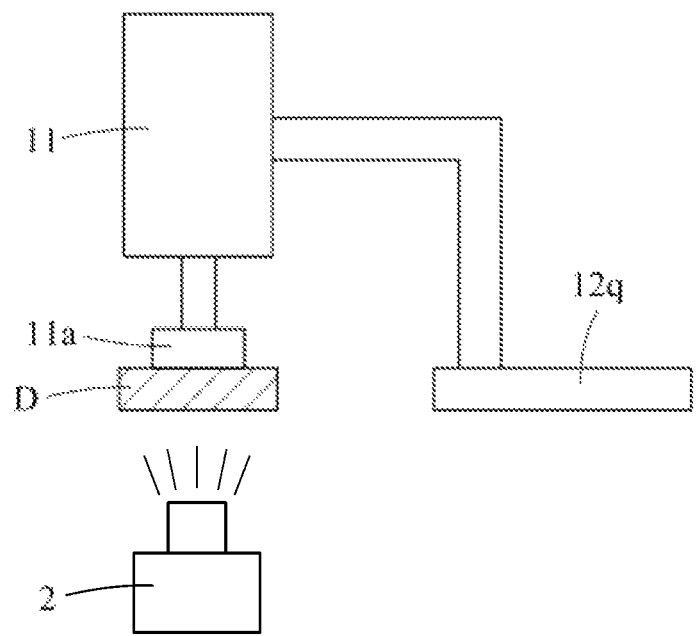

Next, in the two-separate capturing sub-step S1021, as shown in FIGS. 7A-7B, the reference-image capturing device 2 in a reference position respectively captures the image of the marking member 12a (as shown in FIG. 7A) and the image of the chip D which is sucked by the chip-placing member 11a (as shown in FIG. 7B) from an opposite direction of the marking member 12a and the chip-placing member 11a. In detail, the positioning unit 41 controls the chip-placing device 1 to move the predetermined fixed distance L to enable the reference-image capturing device 2 (which is stationary in the reference position) to respectively capture the image of the marking member 12a and the image of the chip D sucked by the chip-placing member 11a. In this embodiment, the image of the marking member 12a is first captured, then the chip-placing device 1 moves the fixed distance L, and the image of the chip D sucked by the chip-placing member 11 is captured afterwards. However, the present invention is not limited thereto. In another example, the image of the chip D sucked by the chip-placing member 11 is first captured, then the chip-placing device 1 moves the fixed distance L, and the image of the marking member 12a is captured afterwards.

Figure 8:
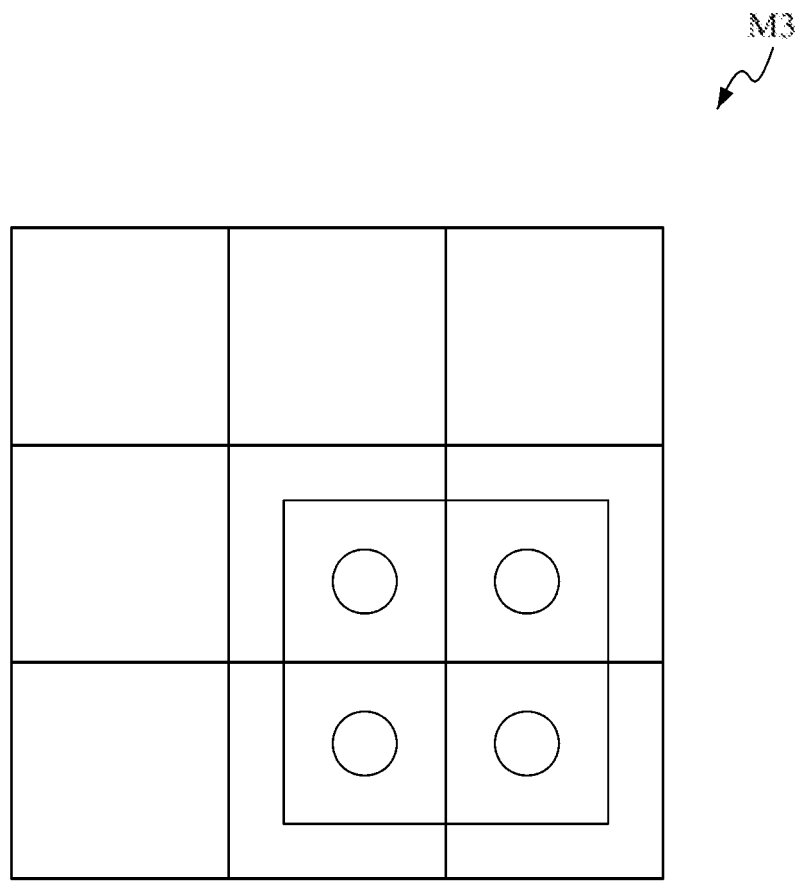
FIG. 8 is a schematic diagram illustrating the overlapping image according to the second embodiment of the present invention.

As shown in FIG. 8, in the image-overlapping sub-step S1022, the image-overlapping unit 44 overlaps the image of the marking member 12a and the image of the chip D sucked by the chip-placing member 11a to generate an overlapping image M3 such that the calculating and processing unit 43 obtains the relative position information of the chip D in relation to the marking member 12a. In this embodiment, the surface of the marking member 12a has a lattice pattern, and the surface of chip D has a specific visual appearance (represented by circles in this embodiment). However, the present invention is not limited thereto. The pattern and arrangement of the surface of the marking member 12a can also be any other marking forms, and the surface of the chip D may be any other kinds of visual appearance.

Figure 9:
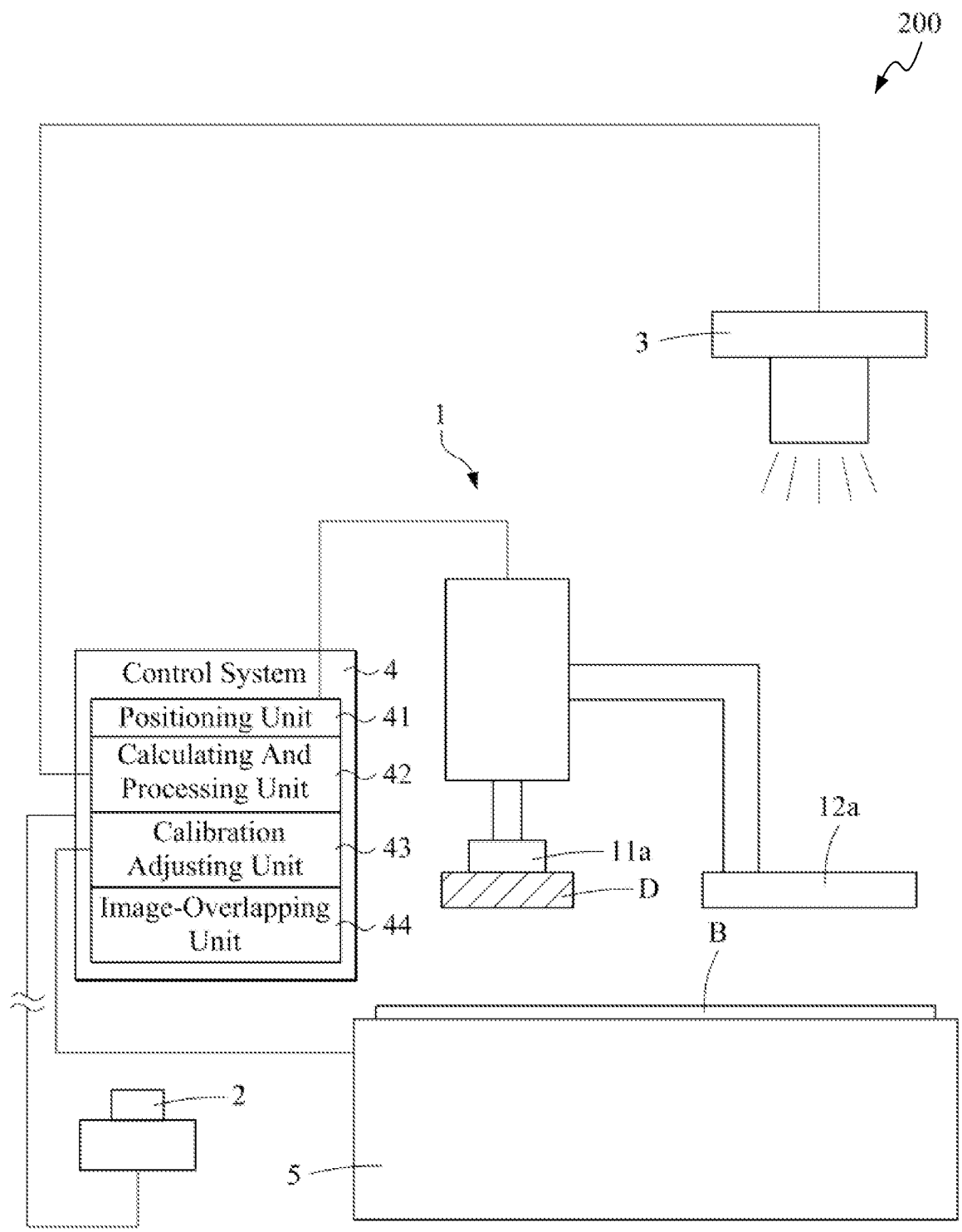
FIG. 9 is a schematic diagram illustrating the chip-placing apparatus according to the second embodiment of the present invention.
Figure 10:
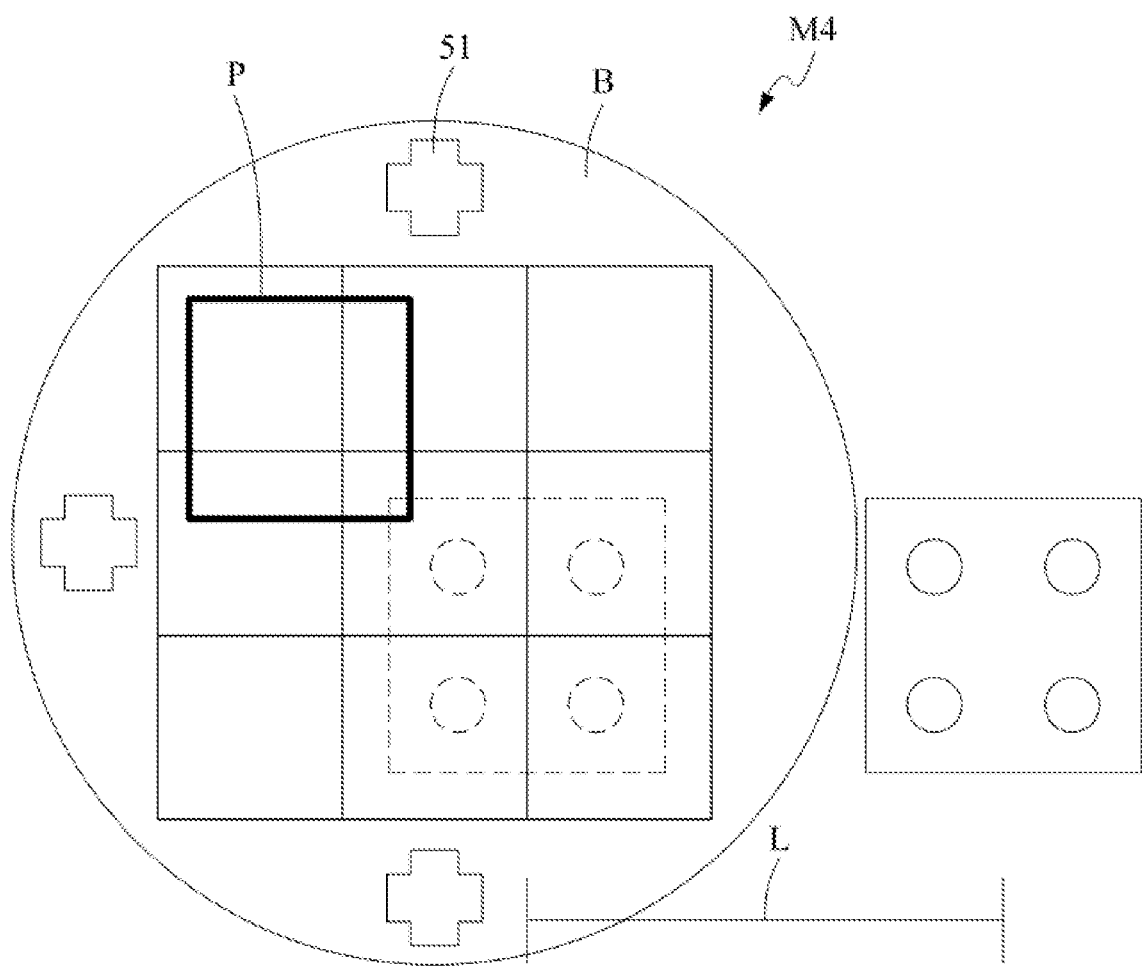
FIG. 10 is a schematic diagram illustrating the position calibration relationship information of the position of the chip sucked by the chip-placing member in relation to a to-be-placed location of the substrate according to the second embodiment of the present invention.

As shown in FIG. 9, then, the chip-placing device 1 is moved by the positioning unit 41 so as to face forward the substrate B. In the alignment-image capturing step S103, the alignment-image capture device 3 captures, from a backside of the marking member 12a, an image M4 showing the marking member 12a and the substrate B (as shown in FIG. 10) such that the calculating and processing unit 42 obtains a relative position information of the marking member 12a in relation to the substrate B. The alignment-image capture device 3 could further include at least one mirror and an image capturing member. The mirror is configured to change the path of the light so that said, image capturing member provided at other positions captures the image M4 showing the marking member 12a and the substrate B from the backside of the marking member 12a.

Next, in the calculating and processing step S104, as shown in FIG. 10, the calculating and processing unit 42 calculates and obtains a position calibration relationship information of the position of the chip D sucked by the chip-placing member 11a in relation to a to-be-placed location P of the substrate B according to the relative position information of the chip D in relation to the marking member 12a and the relative position information of the marking member 12a in relation to the substrate B. In detail, as shown in FIG. 10, the upper left black thick frame is the to-be-placed location P in the image M4 captured by the alignment-image capture device 3, which is the location that the chip D is expected to be placed. Both the "image M4 captured by the alignment-image capture device 3" and the "overlapping image M3 generated by the image-overlapping unit 44" show the image of the marking member 12a. Therefore, by the overlapping image M3, the virtual position of the chip D (as represented by a dotted line) in the image M4 captured by the alignment-image capture device 3 can be obtained by the calculating and processing unit 42. In addition, since the overlapping image M3 is calculated through image overlapping, the virtual position of the chip D is pushed back to the fixed distance L as the current real position of the chip D. Finally, the calculating and processing unit 42 calculates the position calibration relationship information of the virtual position of the chip D in relation to a to-be-placed location P.

It should be noted that the above example calculation method is merely for expatiating the spirit of the present application, and the calculating and processing step S104 of the present application is not limited thereto. A person skilled in the art can obtains a position calibration relationship information of the position of the chip D sucked by the chip-placing member 11a in relation to the to-be-placed location P of the substrate B according to the relative position information of the chip D in relation to the marking member 12a and the relative position information of the marking member 12a in relation to the substrate B by other calculation methods.

For ease of understanding, the to-be-placed location P (the black thick frame) shown in FIG. 10 is located within the image M4 captured by the alignment-image capture device 3. However, the present invention is not limited thereto. The to-be-placed location P may also be located outside the image M4 captured by the alignment-image capture device 3. In the present invention, the to-be-placed location P may be determined by image recognition, or the to-be-placed location P may be determined by other positioning methods. Therefore, the to-be-placed location P is not limited to be within the image M4 captured by the alignment-image capture device 3.

Then, in the calibration adjusting step S105, the calibration adjusting unit 43 calibrates and adjusts the relative position of the chip-placing member 11a in relation to the to-be-placed location P according to the position calibration relationship information so as to align the position of the chip D sucked by the chip-placing member 11a with the to-be-placed location P. In the present embodiment, the position calibration relationship information includes an error relationship information of position and/or angle. The position of the chip D sucked by the chip-placing member 11a is aligned with the to-be-placed location P by the calibration adjusting unit 43 calibrating a relative position and/or a relative angle between the chip-placing member 11a and the to-be-placed location P according to the error relationship information. As shown in FIG. 9, the chip-placing apparatus 200 further includes a mobile stage 5 provided to carry the substrate B. The mobile stage 5 is configured to be in signal connection to the calibration adjusting unit 43. The calibration adjusting unit 43 fine adjusts the position and/or angle of the mobile stage 5 according to the error relationship information such that the position of the chip D sucked by the chip-placing member 11a is aligned with the to-be-placed location P.

Finally, in the chip placing step S106, the positioning unit 41 enables the chip-placing member 11a to place the chip.

Figure 11:
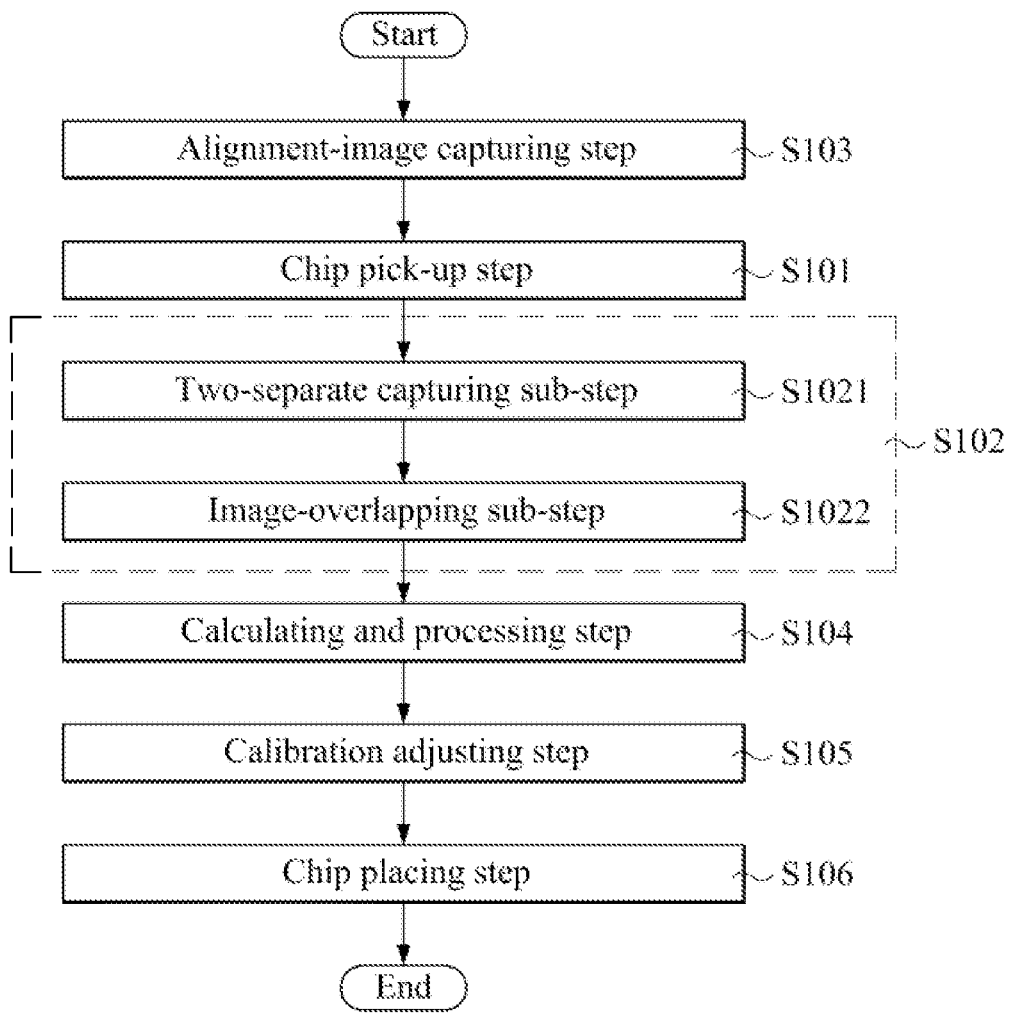
FIG. 11 is a flowchart illustrating the chip-placing method for performing an image alignment of chip placement according to the third embodiment of the present invention.

It should be noted that, in the present embodiment, the alignment-image capturing step S103 is performed after the chip pick-up step S101, and the chip pick-up step S101, the two-separate capturing sub-step S1021, the image-overlapping sub-step S1022, the alignment-image capturing step S103, the calculating and processing step S104, the calibration adjusting step S105, and the chip placing step S106 are performed in sequence. However, the invention is not limited thereto. The alignment-image capturing step S103 could be performed after the chip pick-up step S101 and the two-separate capturing sub-step S1021, but be performed prior to the image-overlapping sub-step S1022. In addition, in the third embodiment of the present invention, as shown in FIG. 11, the alignment-image capturing step S103 is performed prior to the chip pick-up step S101, and the alignment-image capturing step S103, the chip pick-up step S101, the two-separate capturing sub-step S1021, the image-overlapping sub-step S1022, the calculating and processing step S104, the calibration adjusting step S105, and the chip placing step S106 are performed in sequence. In other words, the order of capturing images by the reference-image capturing device 2 and the alignment-image capture device 3 is not limited in the present application. The only requirement is to perform the image-overlapping sub-step S1022 after the two-separate capturing sub-step S1021, and to perform the calculating and processing step S104 and the calibration adjusting step S105 after the image-overlapping sub-step S1022 and the alignment-image capturing step S103.

By the chip-placing method and chip-placing apparatus of the above embodiments, compared with the prior art, the present invention is with advantage that the precision and accuracy for the chip-placing when the substrate B is with identifier(s) 51 and for the arrangement when the substrate B is without identifier 51 can be greatly improved.

The above description should be considered as only the discussion of the preferred embodiments of the present invention. However, a person skilled in the art may make various modifications without deviating from the present invention. Those modifications still fall within the spirit and scope defined by the appended claims.

What is claimed is:

1. A chip-placing method that performs an image alignment for chip placement, the chip-placing method being applied while a chip-placing member of a chip-placement apparatus is configured to move to a to-be-placed location on a substrate, the chip-placing apparatus including a chip-placing device, a reference-image capturing device and an alignment-image capture device, the chip-placing device including the chip-placing member and a marking member adjacent to the chip-placing member, the chip-placing method comprising:

a chip pick-up step that enables the chip-placing member to suck a chip;

a reference-image capturing step that enables the reference-image capturing device to capture an image of the marking member from an opposite direction of the chip-placing device, and captures an image of the chip sucked by the chip-placing member so as to obtain a relative position information of the chip in relation to the marking member;

an alignment-image capturing step that enables the alignment-image capture device to capture, from a backside of the chip-placing device, an image showing the marking member and the substrate so as to obtain a relative position information of the marking member in relation to the substrate;

a calculating and processing step that obtains a position calibration relationship information of the position of the chip sucked by the chip-placing member in relation to a to-be-placed location of the substrate according to the relative position information of the chip in relation to the marking member and the relative position information of the marking member in relation to the substrate;

a calibration adjusting step that calibrates a relative position of the chip-placing member in relation to the to-be-placed location according to the position calibration relationship information so as to align the position of the chip sucked by the chip-placing member with the to-be-placed location; and a chip placing step that enables the chip-placing member to place the chip, wherein the reference-image capturing step includes a two-separate capturing sub-step and an image-overlapping sub-step, the two-separate capturing sub-step enabling the reference-image capturing device in a reference position to respectively capture the image of the marking member and the image of the chip sucked by the chip-placing member, and the image-overlapping sub-step enables the image of the marking member and the image of the chip sucked by the chip-placing member to be overlapped so as to obtain the relative position information of the chip in relation to the marking member, wherein the chip-placing member and the marking member are disposed as separated with each other with a predetermined fixed distance such that the two-separate capturing sub-step enables the chip-placing device to move the predetermined fixed distance to enable the reference-image capturing device in the reference position to respectively capture the image of the marking member and the image of the chip sucked by the chip-placing member.

2. The chip-placing method that performs an image alignment for chip placement of claim 1, wherein the calibration adjusting step enables the position of the chip sucked by the chip-placing member is aligned with the to-be-placed location by calibrating a relative position and/or a relative angle between the chip-placing member and the to-be-placed location according to the position calibration relationship information.

3. The chip-placing method that performs an image alignment for chip placement of claim 1, wherein the alignment-image capturing step is performed prior to the chip pick-up step.

4. The chip-placing method that performs an image alignment for chip placement of claim 1, wherein the alignment-image capturing step is performed after the chip pick-up step.

5. The chip-placing method that performs an image alignment for chip placement of claim 1, wherein the alignment-image capturing step obtains the relative position information of the marking member in relation to the substrate according to a visual characteristic of the substrate.

6. A chip-placing apparatus, comprising:
a chip-placing device including a chip-placing member and a marking member adjacent to the chip-placing member, in which the chip-placing member is operated to suck a chip and performs a chip placement;

a reference-image capturing device configured to capture an image of the marking member from an opposite direction of the chip-placing device, and to capture an image of the chip sucked by the chip-placing member;

an alignment-image capture device configured to capture, from a backside of the chip-placing device, an image showing the marking member and a substrate; and a control system including:
a positioning unit configured to be in power connection to the chip-placing device;

a calculating and processing unit configured to be in signal connection to the reference-image capturing device and the alignment-image capture device, the calculating and processing unit obtaining a relative position information of the chip in relation to the marking member according to the image(s) captured by the reference-image capturing device, the calculating and processing unit obtaining a relative position information of the marking member in relation to the substrate according to the image captured by the alignment-image capture device, the calculating and processing unit calculating a position calibration relationship information of the position of the chip sucked by the chip-placing member in relation to a to-be-placed location of the substrate according to the relative position information of the chip in relation to the marking member and according to the relative position information of the marking member in relation to the substrate; and a calibration adjusting unit configured to be in signal connection to the calculating and processing unit and the positioning unit, the calibration adjusting unit calibrating and adjusting the relative position of the chip-placing member in relation to the to-be-placed location according to the position calibration relationship information so as to align the position of the chip sucked by the chip-placing member with the to-be-placed location wherein the chip-placing member and the marking member are disposed as separated with each other with a predetermined fixed distance, the control system further includes an image-overlapping unit configured to be in signal connection to the reference-image capturing device, the alignment-image capture device and the calculating and processing unit, and the reference-image capturing device in a reference position respectively captures the image of the marking member and the image of the chip sucked by the chip-placing member, and the image of the marking member and the image of the chip sucked by the chip-placing member are overlapped by the image-overlapping unit so as to obtain the relative position information of the chip in relation to the marking member.

7. The chip-placing apparatus of claim 6, wherein the marking member is a photomask or a light transmitting member having image feature symbols.

8. The chip-placing apparatus of claim 6, wherein the position calibration relationship information includes an error relationship information of position and/or angle, and the position of the chip sucked by the chip-placing member is aligned with the to-be-placed location by calibrating a relative position and/or a relative angle of the chip-placing member in relation to the to-be-placed location by the calibration adjusting unit according to the error relationship information.

9. The chip-placing apparatus of claim 8, wherein the calibration adjusting unit controls the positioning unit to fine adjust the chip-placing member according to the error relationship information such that the position of the chip sucked by the chip-placing member is aligned with the to-be-placed location.

10. The chip-placing apparatus of claim 8, further including a mobile stage being provided to carry the substrate, the mobile stage configured to be in signal connection to the calibration adjusting unit, and the calibration adjusting unit fine adjusting the mobile stage according to the error relationship information such that the position of the chip sucked by the chip-placing member is aligned with the to-be-placed location.

11. The chip-placing apparatus of claim 6, further including an identifier that is printed on the substrate, the calculating and processing unit obtaining the relative position information of the marking member in relation to the substrate according to the image of the identifier obtained from the image captured by the alignment-image capture device.

* * * * *